May 19, 1953 H. C. GOODRICH, JR 2,639,374

SIGNAL SEEKING RADIO RECEIVER

Filed June 30, 1948

INVENTOR
HUNTER C. GOODRICH, JR.
BY Philip G. Cooper
ATTORNEY

Patented May 19, 1953 2,639,374

UNITED STATES PATENT OFFICE 2,639,374

SIGNAL SEEKING RADIO RECEIVER

Hunter C. Goodrich, Jr., Collingswood, N. J., assignor to Radio Corporation of America, a corporation of Delaware Application June 30, 1948, Serial No. 36,111

6 Claims. (Cl. 250—20)

This invention pertains to a radio receiver and more particularly to a radio receiver of the signal seeking type, wherein the tuning element of the receiver is driven by a tuning motor during the tuning process, thereby causing the receiver tuner to scan the frequency spectrum until a station is automatically selected. More particularly, this invention pertains to a signal seeking receiver in which the normal audio output tubes of the radio receiver, in conjunction with an added BFO tubes, are used to operate the control relay.

Ordinarily, in operation of signal seeking radio receivers, when it is desired to tune in a station, a tuning motor is started to initiate the tuning process to cause the receiver to scan a particular frequency spectrum. When a signal of sufficient strength is encountered, a portion of the received signal is applied to a control circuit which acts to remove the energy applied to the tuning motor, thereby causing the tuning operation to cease and permit the receiver to remain tuned to the particular received signal.

In signal seeking radio receivers which are of various types, one type employs a beat frequency oscillator which beats against the intermediate frequency of the radio receiver during the automatic signal seeking operation to operate, or trigger, a relay connected in the output circuit of the receiver to stop the signal seeking operation automatically when the station is properly tuned in. An exemplary signal seeking radio receiver utilizing the BFO system is presented in a copending patent application of Hunter C. Goodrich, Jr., Serial Number 29,267, filed May 26, 1948, assigned to Radio Corporation of America.

It has been found that the wide variation in supply voltage encountered, particularly in auto radio operation, makes the control relay actuation, by a single vacuum tube, sometimes critical unless a relatively large trigger voltage can be applied to said tube, or unless its supply voltages are regulated. To reduce the number of tubes in a signal seeking receiver and reduce their current drain, circuits of the invention are used with a separate beat frequency oscillator for operating the control relay with the receiver output tube. To lower the initial control voltage required, the gain of the audio stage preceding the output tube is also used to amplify the beat frequency oscillator output to obtain adequate control power for operation of the control relay.

The present invention contemplates, and it is therefore an object of the present invention, to provide a novel signal seeking radio receiver, which is obtained by utilizing a certain tube or tubes normally employed in the radio receiver to perform an additional function, and by adding a tube with appropriate circuits, provide a BFO system for controlling operation of the control relay to deenergize the tuning motor at a predetermined signal condition.

A further object of the invention is to provide a novel signal seeking radio receiver having greater flexibility and wherein circuits are provided in conjunction with a separate beat frequency oscillator tube to reduce the current drain during signal seeking operation.

A further object of the invention is to provide a novel signal seeking radio receiver employing a separate BFO tube, and wherein the audio stage preceding the output tube is also used to amplify the beat frequency oscillator output to obtain adequate control power for operation of the control relay.

A further object of the invention is to provide a signal seeking radio receiver by utilizing a conventional superheterodyne radio receiver coupled with a separate BFO tube and novel appropriate circuits utilizing the control relay in the plate circuit of the audio output tube.

A further object of the invention is to provide greater flexibility in a signal seeking radio receiver by coupling the input of a separate beat frequency oscillator tube to the intermediate frequency channel, and with the output of the beat frequency oscillator connected to the audio channel, and wherein the control relay is coupled in the voice coil circuit.

Another object of the invention is to provide a novel signal seeking radio receiver wherein initiation of the signal seeking action produces a blanking pulse of predetermined duration to momentarily disable the control circuit by biasing one of the beat frequency amplifier tubes beyond cut-off for a predetermined duration to permit the tuner to scan beyond the effective control range of the previously tuned station.

Further and other objects of the invention may be, and may become apparent, from a perusal of the disclosure herein. It is to be understood that while certain specific illustrations are presented, they are not to be considered as limitations except as defined by the spirit of the appended claims.

Figure 1:
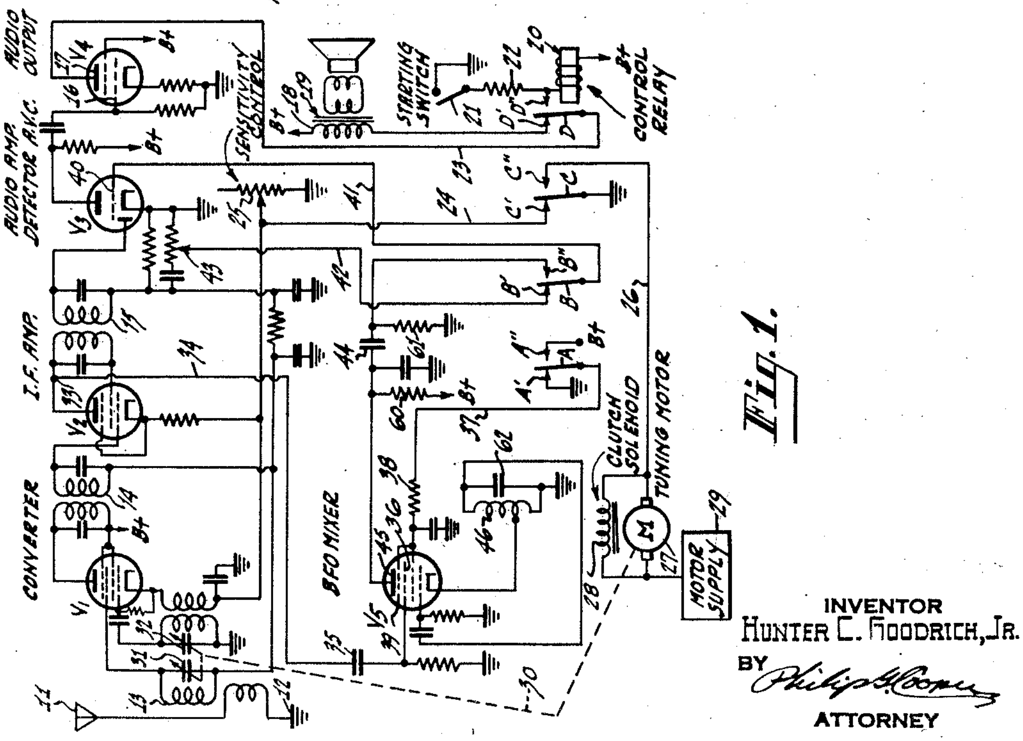
Fig. 1 is a schematic diagram showing the novel signal seeking radio receiver employing a separate BFO tube with the control relay connectable in the plate circuit of the audio output tube.

Referring to the drawings, and more particularly to Fig. 1, there is shown a representative superheterodyne radio receiver circuit employing an antenna 11 and a ground connection 12, shown by conventional symbols, inductively coupled by means of an antenna transformer 13 to the first tube V1 or converter tube of the radio receiver. The output of the converter tube V1 is coupled through the intermediate frequency (I. F.) transformer 14 to the input of the IF amplifier tube V2. The output of the IF amplifier tube V2 is coupled through the IF transformer 15 to the detector plate of the input of the audio amplifier tube V3 which is a multi-purpose tube, and as shown, provides detection and amplification and also supplies automatic volume control (AVC) voltage. The output of the tube V3 is coupled to the input grid 16 of the audio output, or trigger tube V4. The plate 17 of the output tube V4 is connected to a source of positive voltage, indicated by the conventional symbol B+, through primary winding 18 of the impedance-matching output transformer 19 and through a switch actuable by a control relay 20 as will be hereinafter explained. A starting switch 21 together with the movable contacts A, B, C and D of the control relay 20, in the position shown in Fig. 1 hold the radio receiver in normal signal receiving or "playing" condition. Closure of the starting switch 21 will energize the control relay 20, thereby causing the movable contacts A, B, C and D to be shifted away from their respective stationary contacts A', B', C' and D', and into engagement with their contacts A'', B'', CC'' and D'', to place the set in "signal seeking" condition. In normal operation, when the receiver is in "playing" condition for signal reception, the converter tube V1 provides locally generated oscillations for heating with the incoming signals to shift these signals to the intermediate frequency. The intermediate frequency signals are amplified in tube V2, and in tube V3 their audio modulation is detected and the detected audio signals further amplified and fed into the output tube V4 and thence into the low-impedance loudspeaker.

The receiver of the invention is in "playing" condition when the starting switch 21 is open, and the control relay 20 is deenergized so that contact set A—A', B—B', C—C' and D—D' are closed. In order to provide signal seeking operation, the starting switch 21 is momentarily closed to permit the relay 20 to be energized by a voltage source indicated as B+ which is connected through a resistor 22 through the starting switch 21 to ground. Upon energization of the control relay 20, the contact sets A—A', B—B', C—C' and D—D' are opened and contact sets A—A'', B—B'', C—C'' and D—D'' are closed. When the latter condition exists, the circuit shown in Fig. 1 is in "signal seeking" condition.

Opening of contact set D—D' removes the B+ connection from the primary 18 of the output transformer 19 so that the loudspeaker is muted during the "signal seeking" operation. Closure of contact set D—D'' permits current from the B+ supply to be fed through the winding of the control relay 20 thence through conductor 23 to the plate 17 of the audio output tube V4. The control relay accordingly remains energized until the plate current through V4 is cut off for a sufficient duration to permit the control relay to move to the deenergized position. As shown in Fig. 1, plate current cut-off in tube V4 is effected by means of an additional tube V5 connected to operate as a mixer to beat the I. F. signals with beat frequency oscillations generated at the intermediate frequency. The tube V5 may itself include an oscillator section called a beat frequency oscillator (BFO). When carrier signals are not accurately tuned in, they heterodyne with the tuning oscillations (not the beat frequency oscillations) to provide intermediate frequency signals having a frequency somewhat displaced from the center of nominal frequency of the intermediate frequency channel. As the tuning of the receiver approaches the exactly tuned condition, the converted incoming carrier frequency approaches the exact intermediate frequency. The beat signals developed by the mixer tube V5 have a frequency equal to the difference between the frequency of the converted incoming carrier signals and that of the beat frequency oscillator, which in the example given, is the nominal intermediate frequency. Accordingly the frequency of the BFO beat signals moves closer to zero as the tuning becomes more exact. When the output signals of tube V5 are sufficiently low in frequency and high enough in amplitude, they will be large enough when applied to the grid 40 of tube V3 by way of contact B'' to essentially cut off the plate current through tube V4 for the time needed by the movable relay contact D to return to the deergized position D' and open the relay holding circuit at D''. The beat frequency at which the relay opens is a function of the control relay time constant which time constant is sufficiently low to insure accurate tuning.

While control relay 20 is energized, contact set C—C'' is also closed and contact set C—C' is opened. This removes the ground connection through conductor 24 to the sensitivity control 25, providing for control of the stopping sensitivity during signal seeking by the adjustment of control 25. Closure of contact set C—C'' applies the ground connection through conductor 26 to the tuning motor 27 and its clutch solenoid 28 thereby completing the motor energizing circuit from the motor supply 29. Energization of the tuning motor 27 causes rotation of shaft 30, shown by a conventional broken line, to the tuner portion of the radio receiver indicated by variable condensers 31 and 32. While variable condensers are shown specifically, it is to be understood that the shaft 30 may be connected to a permeability tuner, or to any form of tuner which is adaptable for use in conjunction with the tuning motor 27.

The terminal 33 at the plate side of the primary of the second I. F. transformer is connected through a conductor 34 and a capacitor 35 to the signal grid 36 of the BFO mixer tube V5, which is of the frequency converter type. When the contact set A—A' is closed, a conductor 37 which is connected through a resistor 38 to the screen grid 39 of the BFO mixer tube V5, is grounded. When contact set A—A'' is closed, the screen grid 39 of V5 is connected to the B+ lead, thereby impressing an operating voltage on it.

The application of screen voltage to tube V5 when the relay is moved to the energized position by the closure of starting switch 21, permits plate current to flow in V5 and causes a sudden drop in voltage on plate 45 as a result of the voltage drop across plate load resistor 60. This produces a blanking pulse on the grid 40 of tube V3, briefly cutting off V3 until the excess charge on capacitor 44 leaks off through grid resistor 61. The time-constant of capacitor 44 and resistor 61 is of such a value that amplifier tube V3 is disabled for the time interval necessary for the receiver to scan just beyond the range of control of the previously tuned station. A momentary actuation of the starting switch is therefore all that is required to make the receiver scan to the next signal of adequate strength.

When the receiver is in playing condition, the grid 40 of tube V3 is connected through conductor 41, contact set B—B′, conductor 42, to the volume control 43. This circuit is interrupted when contact set B—B′ is opened. Closure of contact set B—B″ then causes the grid 40 of tube V3 to be connected through conductor 41, and capacitor 44, to the plate 45 of the BFO mixer tube V5. At this instant, the voltage impressed upon the screen grid 39 will permit the oscillator section of BFO mixer tube V5 to oscillate at the resonant frequency of inductance 46 and capacitance 62, said resonant frequency being equal to the receiver's intermediate frequency. Energization of the tuning motor will cause the tuner portion of the receiver indicated by variable condensers 31 and 32 to rotate until the next incoming effective signal causes the control relay 20 to be momentarily deenergized, thereby permitting movable contacts A, B, C and D to restore to the normal "playing" condition.

When the receiver is in signal seeking condition, the normal intermediate frequency signal beats with the beat frequency oscillator, thereby producing an audio beat note which is amplified by the tubes V3 and V4. While a signal is being tuned in, and when the negative swing of the beat note on grid 16 of tube V4 is great enough in amplitude, and of sufficiently long duration, that is, sufficiently low in frequency as zero beat is approached, the plate current through tube V4 is cut off and the control relay 20 is deenergized for a period of time sufficient to permit the contacts A, B, C and D to be restored to the normal "playing" condition shown in Fig. 1.

Opening of contact set C—C″ will cause the tuning motor 27 to cease operating and the clutch solenoid 28 to be deenergized. The solenoid operated clutch 28 is of a conventional type which is spring actuated to mechanically decouple the motor from the tuner and mechanically load the tuner to stop rotation thereof as soon as possible after the motor is deenergized.

Figure 2:
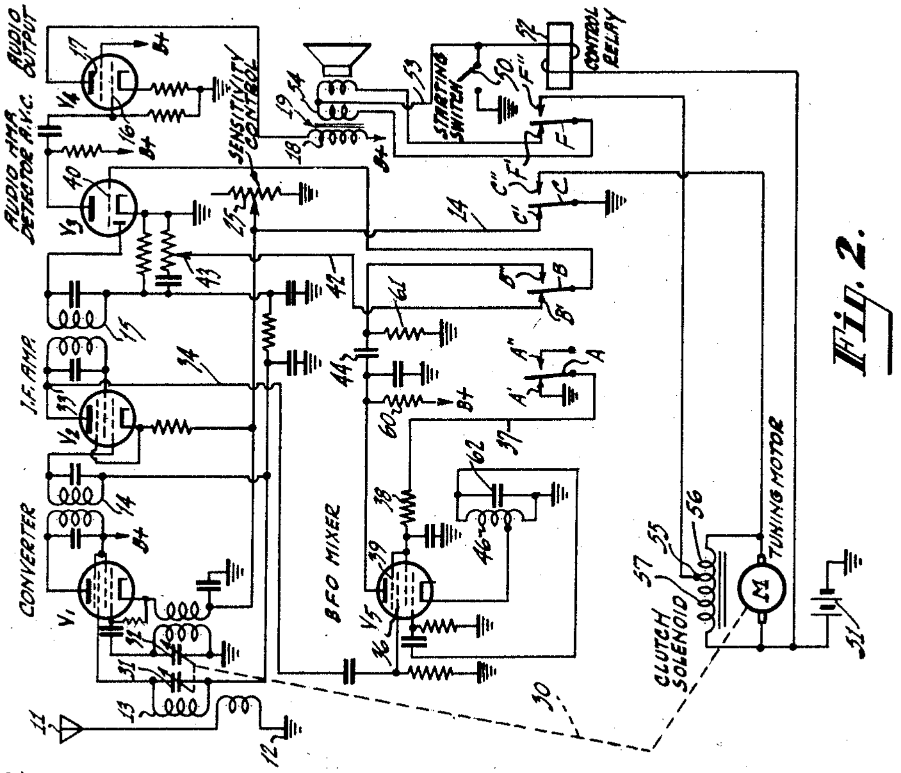
Fig. 2 is a modification of Fig. 1 wherein the control relay is connectable to the secondary of the output transformer.

The modification shown in Fig. 2 is substantially identical with the drawing shown in Fig. 1 as far as the superheterodyne radio receiver per se is concerned. All of the tubes and the main tuning circuits are identical while other similar parts have similar reference characters in both Figs. 1 and 2.

Movable contacts A, B and C and the corresponding stationary contacts shown in Fig. 2 are connected identically with those in Fig. 1 but are part of a control relay 52.

The movable contact F, also part of the control relay 52 in Fig. 2 is connected differently from the corresponding contact D of Fig. 1.

To start the seeking process with the construction of Fig. 2, the starting switch 50 is momentarily closed. Current from the motor supply battery 51 then flows thru the winding of control relay 52 energizing the relay. Upon release of the starting switch, energization of the relay is maintained by the D.-C. current flowing from the battery 51, thru the winding of relay 52, conductor 53, output transformer secondary 54, and thru the set of relay contacts F—F″ to the clutch solenoid tap 55, and thru a portion of the clutch solenoid 56 and the set of relay contacts C—C″ to ground. The D.-C. voltage from the battery 51 appearing across part 57 of the solenoid is thus placed in series with the low impedance output transformer secondary 54 and the control relay 52. As the receiver approaches a signal of adequate strength, an A.-C. voltage of the BFO beat frequency appears across the output transformer secondary 54. This voltage alternately aids and opposes the D.-C. voltage across solenoid part 57 on alternate halves of the beat frequency cycle. When the voltages are equal and opposing, the current flow thru the relay winding momentarily ceases. When the beat frequency becomes sufficiently low, the duration of the current flow stoppage is sufficiently long to permit the relay to open, which removes the D.-C. voltage from the relay winding and deenergizes the relay until the starting switch is again closed. The beat frequency at which the relay opens is a function of the relay time constant which time constant is sufficiently low to insure accurate tuning.

The modification shown in Fig. 2 is particularly applicable to receivers, such as automobile receivers, that are operated from a low voltage source of direct current, and has the advantage of permitting the use of a low resistance control relay winding, which is less expensive, and less subject to corrosive damage by moisture because it has less turns, and is of heavier wire.

What is claimed is:

1. In a signal-seeking radio receiver apparatus: a heterodyne tuning means connected for selectably receiving incoming modulated radio carrier waves in a predetermined band of frequencies, and converting said carrier waves to a predetermined intermediate frequency signal wave; an amplification stage, a demodulation stage and a signal output stage normally connected to said tuning section for reproducing, at an amplified level, the modulation of the converted signals; a beat frequency mixer stage connected with said amplification stage for beating the converted signals with a wave having a fixed intermediate frequency thereby to provide a beat signal output having a frequency that approaches zero as said tuning means approaches exact tuning; signal seeking means for causing said tuning means to scan said band of frequencies, contact sets for selectively coupling said mixer stage in circuit with said output stage, and a relay connected with said output stage to respond to said beat waves, actuate said contact sets and terminate the scanning in response to the beat waves reaching a predetermined low frequency.

2. In a signal-seeking radio receiver having a heterodyne type tuner connected for selecting a modulated radio carrier wave from a predetermined band of radio frequencies and converting the selected carrier wave into a predetermined intermediate frequency wave, and also having a power amplifying stage connected to amplify the modulation of the selected radio carrier wave; a beat frequency mixing stage connected for beating the converted waves with waves of a predetermined fixed intermediate frequency, and supplying beat waves the amplitudes of which depend upon the strength of the selected wave and the frequencies of which approach zero as the selected wave is more accurately tuned in; scanning structure connected for actuation to cause the tuner to scan said predetermined band of radio frequencies; and relay elements connected for controlling the actuation of the scanning structure, for shifting the connection of the power amplifying stage to amplify the beat waves supplied by the mixer stage, and for responding to amplified beat waves of predetermined amplitude and frequency to terminate the scanning and the shifting.

3. The combination as defined by claim 2 in which the power amplifying stage includes an electron-flow device connected in a circuit for energization by an electron flow to vary the electron flow in accordance with the signals supplied by this stage; and the relay elements include relay windings connected for energization to operate the relay and bring the windings in said circuit to maintain the scanning and the shifted amplifier connection until the electron flow in this circuit is arrested for a predetermined interval by an amplified beat signal of predetermined magnitude.

4. The combination as defined by claim 2 and further including a transducer for reproducing the amplified modulation of the incoming modulated carrier waves, the power amplifying stage having an impedance-matching coupling transformer with output windings connected to the transducer, and the relay elements including relay windings connected for energization to carry a direct current as well as signals appearing at the transformer output windings and to automatically deenergize itself in response to beat signals having amplitude and frequency characteristics that cause the current in the relay windings to be interrupted for a predetermined time.

5. In a signal-seeking receiver for operation from a low voltage source of direct current, and having a power amplifying stage coupled by an impedance-matching output transformer with a low impedance secondary winding, to a low impedance transducer: a heterodyne type tuner connected for tuning to select radio carrier waves from a predetermined band of radio frequencies and converting the carrier waves to a predetermined intermediate frequency wave; a beat frequency mixing stage connected for beating the converted waves with waves having a fixed intermediate frequency and supplying beat waves having a frequency that approaches zero as the selected carrier wave is more accurately tuned in, and an amplitude depending upon that of the selected carrier wave; relay elements connected for operation to cause the tuner to scan said predetermined band of radio frequencies to deliver the supplied beat waves to the secondary winding, and to terminate the scanning and delivery in response to supplied beat waves of predetermined low frequency and high amplitude, said relay elements including low resistance relay windings connected for energization by said low voltage source to operate the relay elements and upon such energization to be inserted in series with the secondary winding and the low voltage current source to maintain the energization until the delivered beat waves have frequency and amplitude characteristics that cause interruption of the relay winding current for a predetermined period of time.

6. The combination as defined by claim 5 in which the relay elements are connected to also shift the power amplifying stage to amplify the beat waves supplied by the beat frequency mixer stage, in response to energization of the relay windings.

HUNTER C. GOODRICH, JR.

References Cited in the file of this patent

UNITED STATES PATENTS

| Number | Name | Date |
|---|---|---|
| 2,177,713 | Granqvist | Oct. 31, 1939 |
| 2,224,224 | Hallam | Dec. 10, 1940 |
| 2,262,218 | Andrews | Nov. 11, 1941 |
| 2,387,544 | Usselman | Oct. 23, 1945 |
| 2,516,856 | Cowles | Aug. 1, 1950 |
| 2,526,266 | O'Brien | Oct. 17, 1950 |